US012620959B2

(12) United States Patent
Tang et al.

(10) Patent No.:    US 12,620,959 B2
(45) Date of Patent:       May 5, 2026

(54) FILM BULK ACOUSTIC WAVE RESONATORS AND FILTERS WITH TRANSVERSE MODE SUPPRESSION

(71) Applicant: Skyworks Solutions, Inc., Irvine, CA (US)

(72) Inventors: Gong Bin Tang, Moriguchi (JP); Ousmane I Barry, Settsu (JP); Hiroyuki Nakamura, Osaka-Fu (JP)

(73) Assignee: Skyworks Solutions, Inc., Irvine, CA (US)

( * ) Notice: Subject to any disclaimer, the term of this patent is extended or adjusted under 35 U.S.C. 154(b) by 712 days.

(21) Appl. No.: 17/956,691

(22) Filed: Sep. 29, 2022

(65) Prior Publication Data

US 2023/0112677 A1      Apr. 13, 2023

Related U.S. Application Data

(60) Provisional application No. 63/251,510, filed on Oct. 1, 2021.

(51) Int. Cl.
| | |
|---|---|
| *H03H 9/17* | (2006.01) |
| *H03H 9/02* | (2006.01) |
| *H03H 9/10* | (2006.01) |
| *H03H 9/13* | (2006.01) |
| *H03H 9/56* | (2006.01) |
| *H04B 1/00* | (2006.01) |

(52) U.S. Cl.
CPC .... *H03H 9/02015* (2013.01); *H03H 9/02228* (2013.01); *H03H 9/1014* (2013.01); *H03H 9/133* (2013.01); *H03H 9/171* (2013.01); *H03H 9/173* (2013.01); *H03H 9/564* (2013.01); *H03H 9/568* (2013.01); *H04B 1/0057* (2013.01)

(58) Field of Classification Search
CPC .......... H03H 9/02; H03H 9/133; H03H 9/173; H03H 9/54
See application file for complete search history.

(56) References Cited

U.S. PATENT DOCUMENTS

| | | | |
|---|---|---|---|
| 9,991,871 B2 * | 6/2018 | Zou ......................... | H03H 9/175 |
| 10,756,702 B2 | 8/2020 | Lee et al. | |
| 11,082,023 B2 * | 8/2021 | Shin ........................ | H03H 9/706 |
| 11,316,494 B2 * | 4/2022 | Liu ........................... | H03H 9/54 |

(Continued)

OTHER PUBLICATIONS

Li et al., "Use of double-raised-border structure for quality factor enhancement of type II piston mode FBAR," 2017 Joint Conference of the European Frequency and Time Forum and IEEE International Frequency Control Symposium (EFTF/IFCS), Besancon, France, 2017, pp. 547-550 (Year: 2017).*

*Primary Examiner* — Andrea Lindgren Baltzell
*Assistant Examiner* — Alan Wong
(74) *Attorney, Agent, or Firm* — VIA LLP

(57)                ABSTRACT

A film bulk acoustic wave resonator (FBAR) is disclosed with raised and recessed frame portions formed in a top electrode. The FBAR can include a substrate, a piezoelectric film supported to oscillate in a direction opposite to a main surface of the substrate, and a pair of top and bottom electrodes formed respectively on top and bottom surfaces of the film. The recessed frame portion and the raised frame portion can be formed to extend adjacent to each other along a periphery of an active region of the film oscillating during an operation of the film on a top surface of the top electrode.

18 Claims, 11 Drawing Sheets

(56) References Cited

U.S. PATENT DOCUMENTS

| | | |
|---|---|---|
| 11,349,454 B2 | 5/2022 | Shin et al. |
| 11,387,808 B2 | 7/2022 | Shin et al. |
| 11,431,315 B2 * | 8/2022 | Matsuo ............. H03H 9/02118 |
| 11,595,017 B2 * | 2/2023 | Pollard .................... H03H 3/02 |
| 12,255,629 B2 * | 3/2025 | Komatsu ............... H03H 9/173 |
| 12,418,271 B2 * | 9/2025 | Kovacic ................... H03H 3/04 |
| 2005/0212383 A1 | 9/2005 | Nakamura et al. |
| 2005/0242900 A1 | 11/2005 | Nakamura et al. |
| 2006/0028298 A1 | 2/2006 | Nakamura et al. |
| 2008/0101263 A1 | 5/2008 | Barber et al. |
| 2010/0194496 A1 | 8/2010 | Goto et al. |
| 2011/0215883 A1 | 9/2011 | Fujiwara et al. |
| 2012/0044027 A1 | 2/2012 | Nakanishi et al. |
| 2013/0249647 A1 | 9/2013 | Nakanishi et al. |
| 2015/0243873 A1 | 8/2015 | Nakanishi et al. |
| 2016/0064811 A1 | 3/2016 | Yota et al. |
| 2018/0131344 A1 | 5/2018 | Komatsu et al. |
| 2018/0152191 A1 | 5/2018 | Niwa et al. |
| 2018/0158801 A1 | 6/2018 | Takano |
| 2018/0159493 A1 | 6/2018 | Takano |
| 2018/0159502 A1 | 6/2018 | Takano |
| 2018/0159503 A1 | 6/2018 | Takano |
| 2018/0205530 A1 | 7/2018 | Pehlke |
| 2018/0234076 A1 | 8/2018 | Ando et al. |
| 2019/0149132 A1 | 5/2019 | Komatsu et al. |
| 2019/0246500 A1 | 8/2019 | Takano et al. |
| 2019/0273478 A1 | 9/2019 | Lin et al. |
| 2019/0273480 A1 | 9/2019 | Lin et al. |
| 2020/0021269 A1 | 1/2020 | Takano |
| 2020/0076403 A1 | 3/2020 | Jhung et al. |
| 2020/0083861 A1 | 3/2020 | Matsuo et al. |
| 2020/0091886 A1 | 3/2020 | Matsuo |
| 2020/0099359 A1 * | 3/2020 | Shin ................... H03H 9/02118 |
| 2020/0106463 A1 | 4/2020 | Chang |
| 2020/0127632 A1 | 4/2020 | Takano et al. |
| 2020/0127633 A1 | 4/2020 | Takano et al. |
| 2020/0153407 A1 | 5/2020 | Takano et al. |
| 2020/0212882 A1 | 7/2020 | Shin et al. |
| 2020/0212884 A1 | 7/2020 | Shin et al. |
| 2020/0274515 A1 | 8/2020 | Shin et al. |
| 2020/0274520 A1 | 8/2020 | Shin et al. |
| 2020/0373901 A1 | 11/2020 | Liu et al. |
| 2020/0389151 A1 | 12/2020 | Goto |
| 2021/0028765 A1 | 1/2021 | Wang et al. |
| 2021/0028813 A1 | 1/2021 | Pehlke |
| 2021/0044278 A1 | 2/2021 | Kankar et al. |
| 2021/0050842 A1 | 2/2021 | Tang et al. |
| 2021/0067134 A1 | 3/2021 | Fujiwara et al. |
| 2021/0067136 A1 | 3/2021 | Fujiwara et al. |
| 2021/0075391 A1 | 3/2021 | Matsuo |
| 2021/0083643 A1 | 3/2021 | Liu et al. |
| 2021/0126616 A1 | 4/2021 | Hiramatsu et al. |
| 2021/0143789 A1 | 5/2021 | Azizi |
| 2021/0143795 A1 | 5/2021 | Azizi |
| 2021/0203305 A1 | 7/2021 | Maki |
| 2021/0203376 A1 | 7/2021 | Pehlke |
| 2021/0226607 A1 | 7/2021 | Caron |
| 2021/0280771 A1 | 9/2021 | Hill et al. |
| 2021/0313965 A1 | 10/2021 | Caron |
| 2021/0344321 A1 | 11/2021 | Shin et al. |
| 2022/0014169 A1 | 1/2022 | Caron et al. |
| 2022/0014177 A1 | 1/2022 | Liu et al. |
| 2022/0094323 A1 | 3/2022 | Zhang et al. |
| 2022/0094324 A1 | 3/2022 | Zhang et al. |
| 2022/0094335 A1 | 3/2022 | Zhang et al. |
| 2022/0173716 A1 | 6/2022 | Jhung et al. |
| 2022/0200571 A1 | 6/2022 | Wang et al. |
| 2022/0200572 A1 | 6/2022 | Wang et al. |
| 2022/0209738 A1 | 6/2022 | Torazawa et al. |
| 2022/0209743 A1 | 6/2022 | Liu et al. |
| 2022/0286105 A1 | 9/2022 | Goto et al. |
| 2022/0286108 A1 | 9/2022 | Hill |
| 2022/0321095 A1 | 10/2022 | Liu et al. |
| 2022/0337219 A1 | 10/2022 | Kovacic et al. |
| 2022/0368311 A1 | 11/2022 | Shin et al. |
| 2022/0368312 A1 | 11/2022 | Wang et al. |
| 2022/0393664 A1 | 12/2022 | Liu et al. |
| 2023/0013597 A1 | 1/2023 | Goto et al. |
| 2023/0031753 A1 | 2/2023 | Goto et al. |
| 2023/0032325 A1 | 2/2023 | Goto et al. |
| 2023/0036775 A1 | 2/2023 | Goto et al. |
| 2023/0070350 A1 | 3/2023 | Goto |
| 2023/0094376 A1 | 3/2023 | Fujiwara et al. |
| 2023/0095556 A1 | 3/2023 | Komatsu et al. |
| 2023/0096749 A1 | 3/2023 | Komatsu et al. |
| 2023/0098495 A1 | 3/2023 | Shin et al. |
| 2023/0099342 A1 | 3/2023 | Zou et al. |
| 2023/0105726 A1 | 4/2023 | Tang et al. |
| 2023/0107684 A1 | 4/2023 | Watanabe et al. |
| 2023/0112677 A1 | 4/2023 | Tang et al. |
| 2023/0124493 A1 | 4/2023 | Shin et al. |
| 2023/0142089 A1 | 5/2023 | Takano et al. |
| 2023/0147252 A1 | 5/2023 | Sun et al. |
| 2023/0163748 A1 | 5/2023 | Goto et al. |

* cited by examiner

FILM BULK ACOUSTIC WAVE RESONATORS AND FILTERS WITH TRANSVERSE MODE SUPPRESSION

INCORPORATION BY REFERENCE TO ANY PRIORITY APPLICATIONS

This application is based upon and claims the benefit of priority from U.S. Provisional Patent Application No. 63/251,510 filed on Oct. 1, 2021. Any applications for which a foreign or domestic priority claim is identified in the Application Data Sheet as filed with the present application are hereby incorporated by reference under 37 CFR 1.57. The entire contents of each of the above-listed items is hereby incorporated into this document by reference and made a part of this specification for all purposes, for all that each contains.

BACKGROUND

Technical Field

Embodiments of this disclosure relate to film bulk acoustic wave resonators and filters used for radio frequency bandwidths to reduce a spurious mode.

Description of Related Technology

Acoustic wave devices such as bulk acoustic wave (BAW) devices can be used as components for filters in radio frequency electronic systems. For instance, filters in a radio frequency front end of a mobile phone can include acoustic wave filters. Two acoustic wave filters can be arranged as a duplexer.

SUMMARY OF CERTAIN INVENTIVE ASPECTS

A film bulk acoustic wave resonator of the present disclosure includes a substrate, a piezoelectric film supported to oscillate in a direction opposite to a main surface of the substrate, and a pair of top and bottom electrodes formed respectively on top and bottom surfaces of the film, where a recessed frame portion and a raised frame portion are formed to extend adjacent to each other along a periphery of an active area of the film oscillating during an operation of the film on a top surface of the top electrode and the recessed frame is formed along an inner periphery of the raised frame.

The recessed frame portion may have a first width and a top surface of the recessed frame portion is recessed by a certain distance from the top surface of the top electrode. The raised frame may have a second width and a top surface of the raised frame is raised by a certain distance from the top surface of the top electrode.

A film bulk acoustic wave resonator of the present disclosure includes a substrate, a piezoelectric film supported to oscillate in a direction opposite to a main surface of the substrate, and a pair of top and bottom electrodes formed respectively on top and bottom surfaces of the film, where a recessed frame portion and a raised frame portion are formed to extend adjacent to each other along a periphery of an active region of the film oscillating during an operation of the film on a top surface of the film and the recessed frame portion is formed along an inner periphery of the raised frame.

The recessed frame portion may have a first width and a top surface of the recessed frame portion is recessed by a certain distance from the top surface of the film. The raised frame may have a second width and a top surface of the raised frame is raised by a certain distance from the top surface of the film.

A film bulk acoustic wave filter of the present disclosure includes a plurality of film bulk acoustic wave resonators configured to filter a radio frequency signal, where at least one of the plurality of film bulk acoustic wave resonators includes a substrate, a piezoelectric film supported to oscillate in a direction opposite to a main surface of the substrate, and a pair of top and bottom electrodes formed respectively on top and bottom surfaces of the film. A recessed frame portion and a raised frame portion are formed to extend adjacent to each other along a periphery of an active region of the film oscillating during an operation of the film on a top surface of the top electrode and the recessed frame is formed along an inner periphery of the raised frame.

Further, a film bulk acoustic wave filter of the present disclosure includes a plurality of film bulk acoustic wave resonators configured to filter a radio frequency signal, where at least one of the plurality of film bulk acoustic wave resonators includes a substrate, a piezoelectric film supported to oscillate in a direction to a main surface of the substrate, and a pair of top and bottom electrodes formed respectively on top and bottom surfaces of the film. A recessed frame portion and a raised frame portion are formed to extend adjacent to each other along a periphery of an active region of the film oscillating during an operation of the film on a top surface of the film and the recessed frame portion is formed along an inner periphery of the raised frame portion.

The film bulk acoustic wave filter may include a ladder filter having a pass band in a radio frequency band. At least one of the film bulk acoustic wave resonators may be included in a series arm between an input node and an output node of the ladder filter. At least one of the film bulk acoustic wave resonators may be included in at least one of a plurality of parallel arms connecting a plurality of nodes between the film bulk acoustic wave resonators to a ground level.

A film bulk acoustic wave filter assembly of the present disclosure includes a first film bulk acoustic wave filter coupled to a common node and a second film bulk acoustic wave filter coupled to the common node, where the first and second film bulk acoustic wave resonators include a plurality of film bulk acoustic wave resonators configured to filter a radio frequency signal. At least one of the film bulk acoustic wave resonators includes a substrate, a piezoelectric film supported to oscillate in a direction opposite to a main surface of the substrate, and a pair of top and bottom electrodes formed respectively on top and bottom surfaces of the film, where a recessed frame portion and a raised frame portion are formed to extend adjacent to each other along a periphery of an active region of the film oscillating during an operation of the film on a top surface of the top electrode and the recessed frame portion is formed along an inner periphery of the raised frame portion.

A film bulk acoustic wave filter assembly of the present disclosure includes a first film bulk acoustic wave filter coupled to a common node and a second film bulk acoustic wave filter coupled to the common node, where the first and second film bulk acoustic wave resonators include a plurality of film bulk acoustic wave resonators configured to filter a radio frequency signal. At least one of the film bulk acoustic wave resonators includes a substrate, a piezoelectric film supported to oscillate in a direction opposite to a main surface of the substrate, and a pair of top and bottom electrodes formed respectively on top and bottom surfaces of the film, where a recessed frame portion and a raised frame portion are formed to extend adjacent to each other along a periphery of an active region of the film oscillating during an operation of the film on a top surface of the film and the recessed frame portion is formed along an inner periphery of the raised frame portion.

The film bulk acoustic wave filter assembly may further include a third film bulk acoustic wave filter coupled to the common node and a fourth film bulk acoustic wave filter coupled to the common node.

A wireless communication device of the present disclosure includes an antenna and a multiplexer coupled to the antenna, where the multiplexer includes a plurality of filters coupled to a common node and arranged to filter a radio frequency signal. The plurality of filters include a film bulk acoustic wave filter, where the film bulk acoustic wave filter includes a plurality of film bulk acoustic wave resonators. At least one of the film bulk acoustic wave resonators includes a substrate, a piezoelectric film supported to oscillate in a direction opposite to a main surface of the substrate, and a pair of top and bottom electrodes formed respectively on top and bottom surfaces of the film, where a recessed frame portion and a raised frame portion extend adjacent to each other along a periphery of an active region of the film oscillating during an operation of the film on a top surface of the top electrode and the recessed frame portion is formed along an inner periphery of the raised frame portion.

Further, a wireless communication device of the present disclosure includes an antenna and a multiplexer coupled to the antenna, where the multiplexer includes a plurality of filters coupled to a common node and arranged to filter a radio frequency signal. The plurality of filters include a film bulk acoustic wave filter, where the film bulk acoustic wave filter includes a plurality of film bulk acoustic wave resonators. At least one of the film bulk acoustic wave resonators includes a substrate, a piezoelectric film supported to oscillate in a direction opposite to a main surface of the substrate, and a pair of top and bottom electrodes formed respectively on top and bottom surfaces of the film, where a recessed frame portion and a raised frame portion extend adjacent to each other along a periphery of an active region of the film oscillating during an operation of the film on a top surface of the film and the recessed frame portion is formed along an inner periphery of the raised frame portion.

A bulk acoustic wave resonator of the present disclosure includes a substrate, a piezoelectric layer on the substrate, and first and second electrodes on opposing sides of the piezoelectric layer, where the first electrode includes a recessed frame portion formed along a periphery of an active region of the bulk acoustic wave resonator, and the second electrode is disposed opposite to the substrate via a cavity.

Further, a bulk acoustic wave resonator of the present disclosure includes a substrate, a piezoelectric layer on the substrate, and first and second electrodes on opposing sides of the piezoelectric layer, where the first electrode includes a recessed frame portion formed along a periphery of an active region of the bulk acoustic wave resonator, and the second electrode is disposed opposite to the substrate via a cavity. The first electrode is configured to have a thickness of the recessed frame portion equal to a thickness of a portion other than the recessed frame portion, and the recessed frame portion is configured to correspond to a recessed portion formed in the piezoelectric layer.

Within the active region, the surface height of the piezoelectric layer from the second electrode inside the recessed frame portion may be different from the surface height of the piezoelectric layer from the second electrode outside the recessed frame portion. The surface height of the piezoelectric layer from the second electrode outside the recessed frame portion may be greater than the surface height of the piezoelectric layer from the second electrode inside the recessed frame portion.

The bulk acoustic wave resonator may further include a passivation layer formed on a surface of the first electrode. The passivation layer may include a recessed frame portion corresponding to the recessed frame portion of the first electrode.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
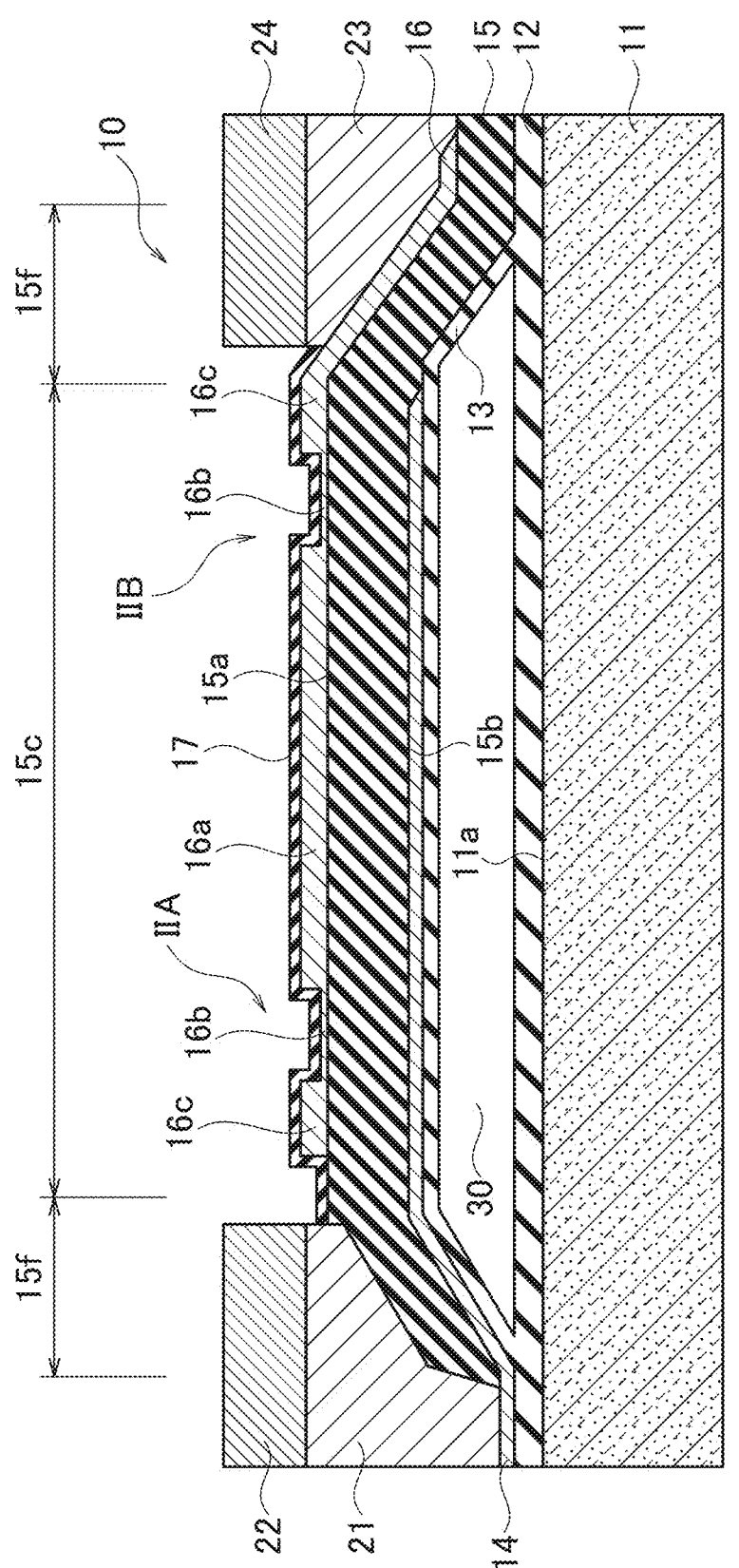
FIG. 1 is a cross-sectional view of a film bulk acoustic wave resonator according to a first embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film Bulk Acoustic Wave Resonator

A film bulk acoustic wave resonator (FBAR) is a type of a bulk acoustic wave (BAW) resonator commonly including a piezoelectric film. This piezoelectric film can be sandwiched between a top electrode and a bottom electrode and suspended over a cavity that may allow the piezoelectric film to oscillate. A signal applied between the top electrode and the bottom electrode may generate an acoustic wave in the piezoelectric film and the acoustic wave may propagate through the film. The FBAR may have a signal applied and provide a frequency response having a resonant peak, which can be determined according to a thickness of the piezoelectric film. Ideally, an acoustic wave generated by the FBAR can be a main acoustic wave that propagates through the piezoelectric film in a direction perpendicular to conductive material layers forming the top and bottom electrodes.

However, the piezoelectric material of the FBAR may typically have non-zero Poisson's ratio. Thus, piezoelectric compressions and relaxations associated with the propagation of the main acoustic wave may cause piezoelectric compressions and relaxations in a direction perpendicular to the propagation direction of the main acoustic wave. These piezoelectric compressions and relaxations in the direction perpendicular to the propagation direction of the main acoustic wave may generate a transverse acoustic wave that propagates through the piezoelectric material perpendicularly to the main acoustic wave, parallel to a surface of the electrode film. The transverse acoustic wave that is reflected and returned into a region where the main acoustic wave propagates may induce a spurious acoustic wave that travels in the same direction as the main acoustic wave travels. Such a spurious acoustic wave may degrade the frequency response of the FBAR compared with an expected or intended frequency response.

First Embodiment

FIG. 1 is a cross-sectional view of a FBAR 10 according to a first embodiment. The FBAR 10 includes a substrate 11 formed of silicon for example. A top surface 11a configured as a main surface of the substrate 11 is covered with a dielectric layer 12 formed of silicon dioxide, for example. A piezoelectric film 15 formed of aluminum nitride (AlN) for example defines a dome-shaped cavity 30 over the top surface 11a of the substrate 11. The piezoelectric film 15 is formed to extend substantially parallel to the top surface 11a with a gap of a certain height from the top surface 11a in a certain region on the top surface 11a. As being farther from the region, the piezoelectric film 15 forms a slope region 15f and then is in contact with a dielectric layer 12 covering the top surface 11a.

A top electrode 16 formed of metal material such as ruthenium (Ru) or molybdenum (Mo) is disposed on a portion of the top surface 15a of the piezoelectric film 15. The top surface 15a of the piezoelectric film 15 and the top electrode 16 are covered with a passivation layer 17 formed of a dielectric material such as silicon dioxide. The top electrode 16 is electrically connected to a bottom electrical contact 23 formed of copper (Cu) for example, on a location where the piezoelectric film 15 is in contact with the dielectric layer 12 over the top surface 11a of the substrate 11. A bottom electrical contact covering layer 24 formed of copper (Cu) for example is stacked on the bottom electrical contact 23. A bottom electrode 14 formed of metal material such as ruthenium (Ru) or molybdenum (Mo) is disposed on a portion of the bottom surface 15b of the piezoelectric film 15. The bottom surface 15b of the piezoelectric film 15 and the bottom electrode 14 are covered with an oxide layer 13 of silicon dioxide, for example. The bottom electrode 14 is electrically connected to a bottom electrical contact 21 formed of copper (Cu) for example, on a location where the piezoelectric film 15 is in contact with the dielectric layer 12 over the top surface 11a of the substrate 11. A bottom electrical contact covering layer 22 formed of copper (Cu) for example is stacked on the bottom electrical contact 21.

The piezoelectric film 15 includes an active region 15c where a main acoustic wave can oscillate during operation. The active region 15c is supported via the slope region 15f connected to the active region 15c by the top surface 11a of the substrate 11 in contact with the piezoelectric film 15 to allow the piezoelectric film 15 of the active region 15c to oscillate in directions perpendicular to the top surface 11a such that an acoustic wave can be excited.

Figure 2A:
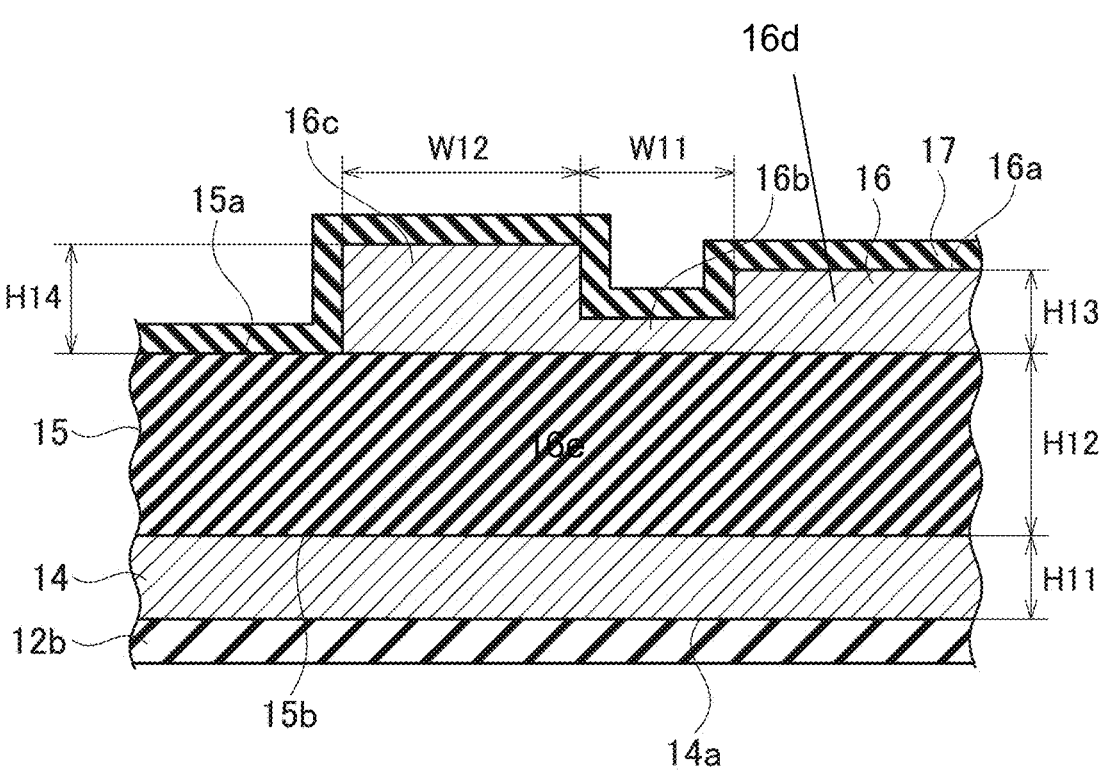
FIG. 2A is an enlarged cross-sectional view of a portion of the film bulk acoustic wave resonator according to the first embodiment shown in FIG. 1.
Figure 2B:
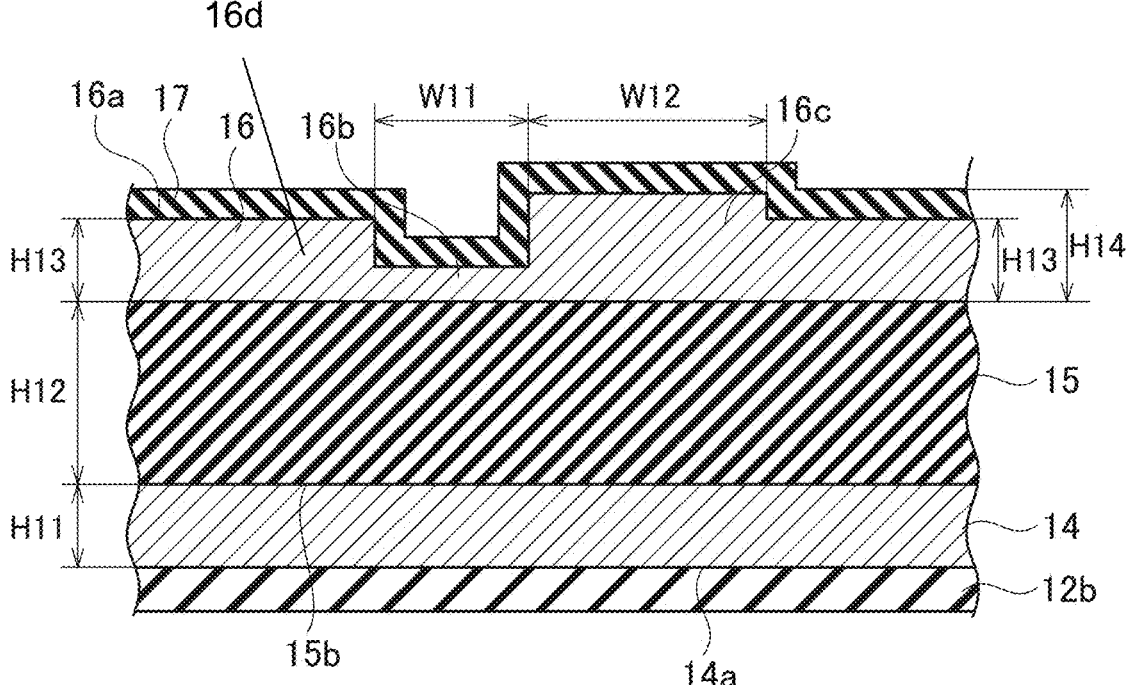
FIG. 2B is an enlarged cross-sectional view of another portion of the film bulk acoustic wave resonator according to the first embodiment shown in FIG. 1.

FIG. 2A is an enlarged cross-sectional view of a portion IIA of the FBAR 10 according to the first embodiment shown in FIG. 1. FIG. 2B is an enlarged cross-sectional view of a portion IIB of the FBAR 10. The top electrode 16 formed on the top surface 15a of the piezoelectric film 15 includes a recessed frame portion 16b and a raised frame portion 16c extending adjacent to each other around the active region 15c of the piezoelectric film 15. In the recessed frame portion 16b, the top surface 16a of the top electrode 16 is recessed by a certain depth across a first width W11. In the raised frame portion 16c, the top surface 16a of the top electrode 16 is raised by a certain height across a second width W12. The recessed frame portion 16b is disposed along an inner periphery of the raised frame portion 16c. The first width W11 may range from 1.0 μm to 1.5 μm, and may be 1.25 um, for example. The second width W12 may range from 3.0 μm to 5.0 μm, and may be 4.0 um, for example. The top electrode 16 may have a height H13, i.e., the height from the top surface 15a of the film 15 to the top surface 16a of an inner portion 16d of the top electrode 16 within the periphery of the recessed frame portion 16b, which may range from 0.2 μm to 0.4 μm, and may be 0.3 um, for example. The recessed frame portion 16b may have a height within a range of a certain distance recessed from the height H13 of the top surface of the top electrode 16. For example, the height of the recessed frame portion 16b may be lower than 0.3 um. The raised frame portion 16c may have a height H14 within a range of a distance from 0.02 μm to 0.03 um more raised than the height H13 of the top surface 16a of the top electrode 16. For example, the height of the raised frame portion 16c may be 0.325 um. The piezoelectric film may have a height H12 ranging from 1.2 μm to 2.0 um. The height H12 may be 1.6 um, for example. The bottom electrode 14 may have a height H11 ranging from 0.2 μm to 0.4 um. The height H11 may be 0.3 um, for example. As shown, in the first embodiment, the top surface of the film 15 below the recessed frame portion 16b and the raised frame portion 16c is flat and, for example, not raised or recessed with respect to the portion of the top surface of the film 15 residing beneath the inner portion 16d of the top electrode 16.

An acoustic wave may have an increased resonant frequency in the region where the top surface 16a of the top electrode 16 is recessed and the top electrode 16 is thinner on the piezoelectric film 15. In addition, an acoustic wave may have a decreased resonant frequency in the region where the top surface 16a of the top electrode 16 is raised and the top electrode is thicker. Thus, the resonant frequency of the acoustic wave can be controlled on the edge of the active region 15c by providing the top surface 16a of the top electrode 16 with the recessed frame portion 16b and the raised frame portion 16c toward the periphery of the active region 15c in the piezoelectric film 15. Accordingly, a transverse acoustic wave in the piezoelectric film 15 can be suppressed and generation of a spurious mode due to the transverse acoustic wave can be reduced.

Figure 3:
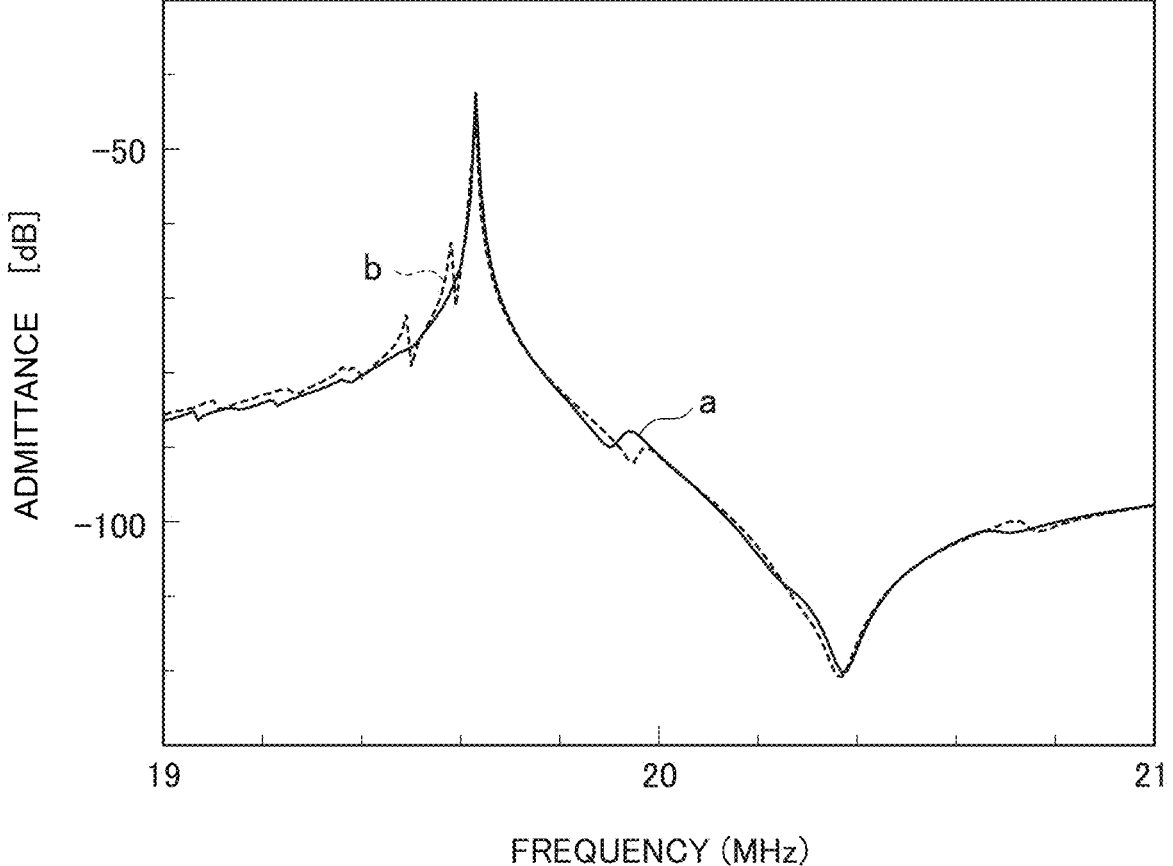
FIG. 3 is a graph showing a frequency characteristic of the film bulk acoustic wave resonator according to the first embodiment.

FIG. 3 is a graph showing a frequency characteristic of the FBAR 10 according to the first embodiment. A solid line "a" in this figure shows the frequency characteristic of the FBAR 10 according to the first embodiment. Also, a dashed line "b" in this figure shows a frequency characteristic of a comparative example FBAR 100 as described later. The comparative example FBAR 100 may have a configuration similar to the FBAR 10 according to the first embodiment except that none of the recessed frame portion 16b and the raised frame portion 16c is formed. As can be observed in the graph, the generation of a spurious mode (e.g., reflected by the spikes and sawtooth features in the waveform) that is seen in a lower range than the resonant frequency in the comparative example FBAR 100 shown by the dashed line "b" is significantly suppressed in the FBAR 10 according to the first embodiment shown by the solid line "a." Accordingly, the recessed frame portion 16b and the raised framed portion 16c in the FBAR 10 of the first embodiment are beneficial in suppressing a spurious mode.

Figure 4:
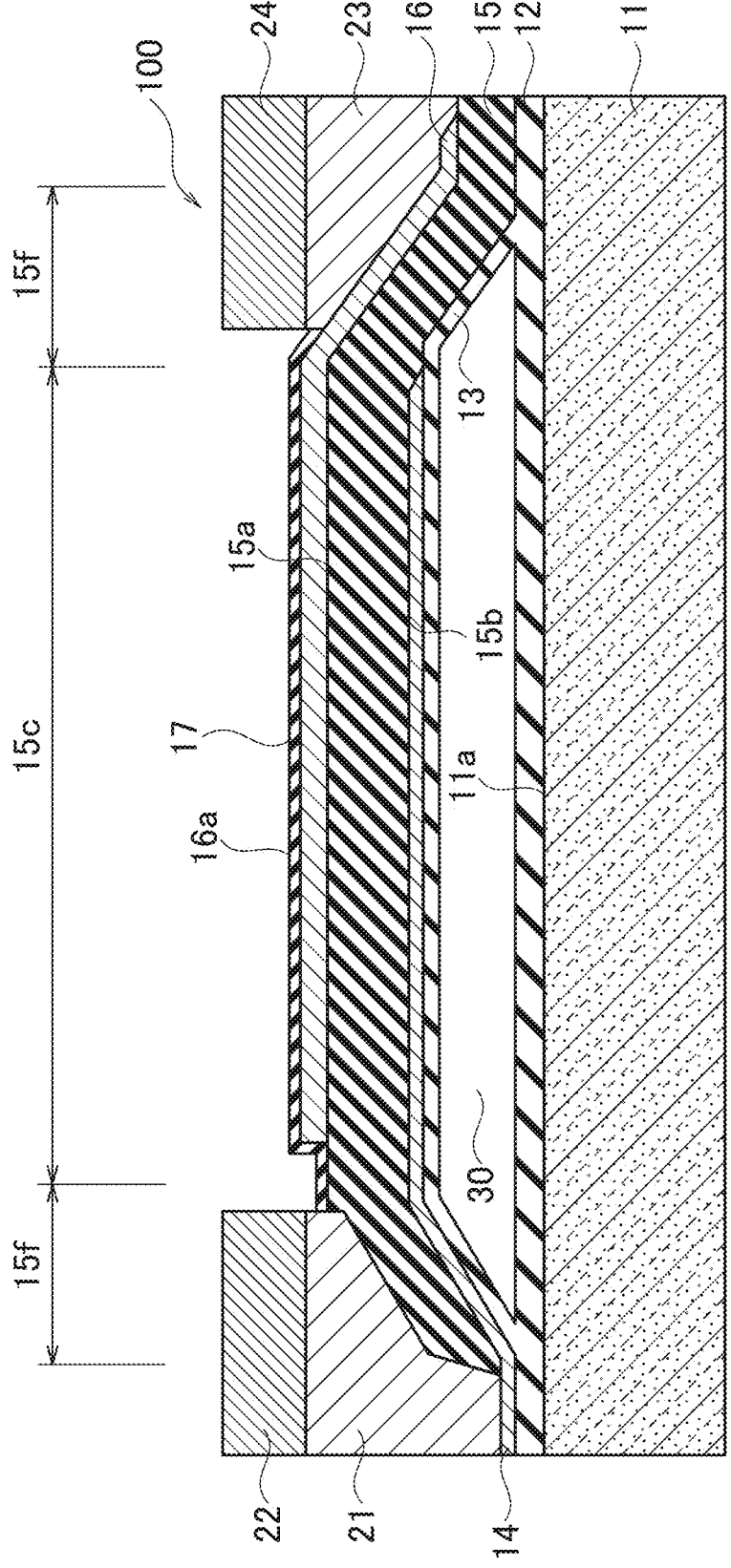
FIG. 4 is a cross-sectional view of a comparative example film bulk acoustic wave resonator.

FIG. 4 is a cross-sectional view of the comparative example FBAR 100. The comparative example FBAR 100 is different from the FBAR 10 of the first embodiment in that the FBAR 100 includes none of the recessed frame portion 16b and the raised frame portion 16c of the FBAR 10, while the other configurations of the FBAR 100 are similar to those of the FBAR 10. Thus, like reference numerals are used to indicate identical components between the FBAR 110 and the FBAR 10 of the first embodiment.

The comparative example FBAR 100 includes a substrate 11 formed of silicon for example. A top surface 11a configured as a main surface of the substrate 11 is covered with a dielectric layer 12 formed of silicon dioxide for example. A piezoelectric film 15 formed of aluminum nitride (AlN) for example defines a dome-shaped cavity 30 over the top surface 11a of the substrate 11. The piezoelectric film 15 is formed to extend substantially parallel to the top surface 11a with a gap of a certain height from the top surface 11a in a certain region on the top surface 11a. As being farther from the region, the piezoelectric film 15 forms a slope region 15f and then is in contact with a dielectric layer 12 covering the top surface 11a.

A top electrode 16 formed of metal material such as ruthenium (Ru) or molybdenum (Mo) is disposed on a portion of the top surface 15a of the piezoelectric film 15. The top surface 15a of the piezoelectric film 15 and the top electrode 16 are covered with a passivation layer 17 formed of a dielectric material such as silicon dioxide. The top electrode 16 is electrically connected to a bottom electrical contact 23 formed of copper (Cu) for example, on a location where the piezoelectric film 15 is in contact with the dielectric layer 12 over the top surface 11a of the substrate 11. A bottom electrical contact covering layer 24 formed of copper (Cu) for example is stacked on the bottom electrical contact 23. A bottom electrode 14 formed of metal material such as ruthenium (Ru) or molybdenum (Mo) is disposed on a portion of the bottom surface 15b of the piezoelectric film 15. The bottom surface 15b of the piezoelectric film 15 and the bottom electrode 14 are covered with an oxide layer 13 of silicon dioxide for example. The bottom electrode 14 is electrically connected to a bottom electrical contact 21 formed of copper (Cu) for example, on a location where the piezoelectric film 15 is in contact with the dielectric layer 12 over the top surface 11a of the substrate 11. A bottom electrical contact covering layer 22 formed of copper (Cu) for example is stacked on the bottom electrical contact 21.

The piezoelectric film 15 includes an active region 15c where a main acoustic wave can oscillate during operation. The active region 15c is supported via the slope region 15f connected to the active region 15c by the top surface 11a of the substrate 11 in contact with the piezoelectric film 15 to allow the piezoelectric film 15 of the active region 15c to oscillate in directions perpendicular to the top surface 11a such that an acoustic wave can be excited.

Second Embodiment

Figure 5:
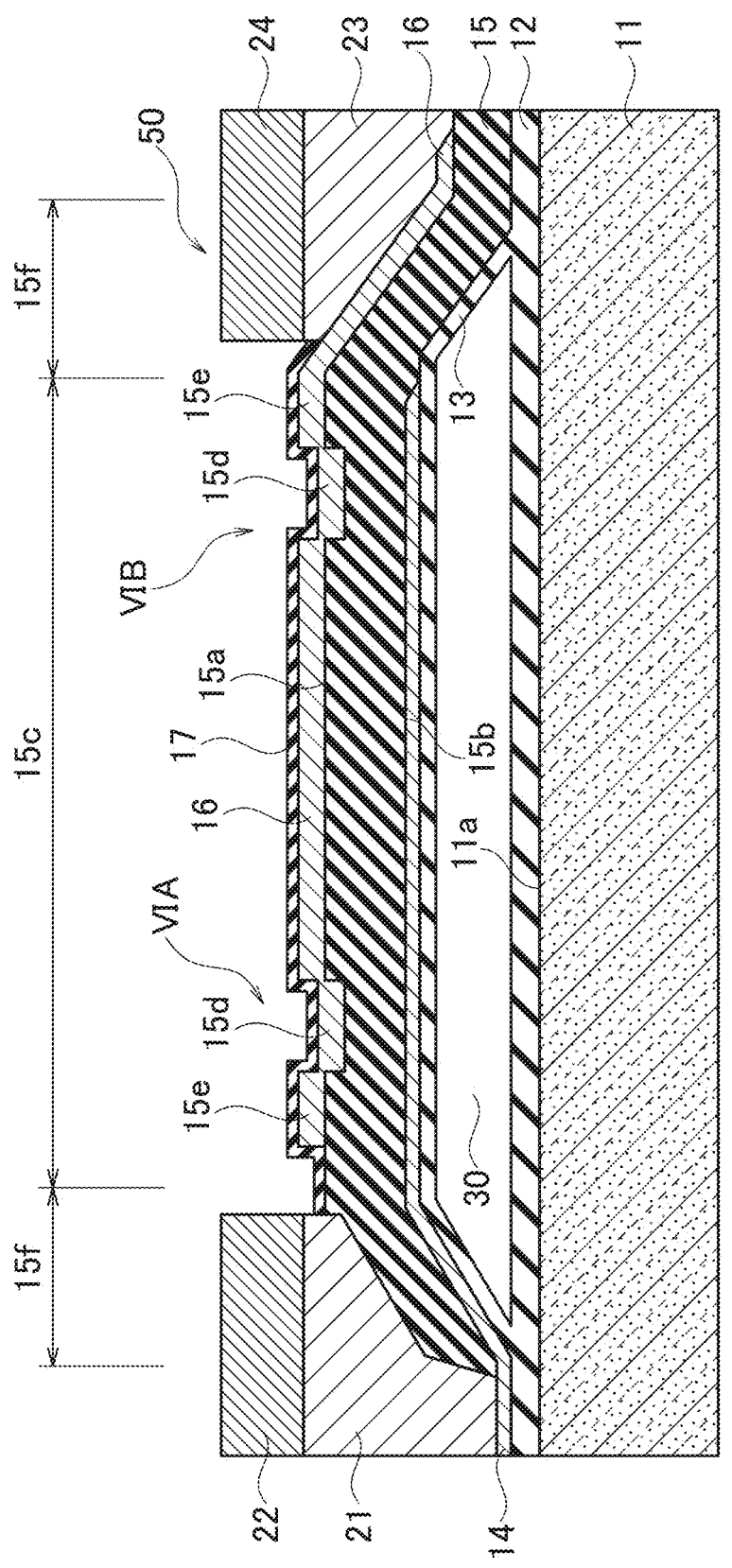
FIG. 5 is a cross-sectional view of a film bulk acoustic wave resonator according to a second embodiment.

FIG. 5 is a cross-sectional view of a FBAR 50 according to a second embodiment. The FBAR 50 of the second embodiment is similar to the FBAR 10 of the first embodiment except that the FBAR 50 of the second embodiment has a recessed frame portion 15d and a raised frame portion 15e formed in the piezoelectric film 15 whereas the FBAR 10 of the first embodiment has the recessed frame portion 16b and the raised frame portion 16c formed in the top electrode 16. Thus, like reference numerals are used to indicate identical components between the FBAR 50 of the second embodiment and the FBAR 10 of the first embodiment.

The FBAR 50 includes a substrate 11 formed of silicon for example. A top surface 11a configured as a main surface of the substrate 11 is covered with a dielectric layer 12 formed of silicon dioxide, for example. A piezoelectric film 15 formed of aluminum nitride (AlN) for example defines a dome-shaped cavity 30 over the top surface 11a of the substrate 11. The piezoelectric film 15 is formed to extend substantially parallel to the top surface 11a with a gap of a certain height from the top surface 11a in a certain region on the top surface 11a. As being farther from the region, the piezoelectric film 15 forms a slope region 15f and then is in contact with a dielectric layer 12 covering the top surface 11a.

A top electrode 16 formed of metal material such as ruthenium (Ru) or molybdenum (Mo) is disposed on a portion of the top surface 15a of the piezoelectric film 15. The top surface 15a of the piezoelectric film 15 and the top electrode 16 are covered with a passivation layer 17 formed of silicon dioxide, for example. The top electrode 16 is electrically connected to a bottom electrical contact 23 formed of copper (Cu) for example, on a location where the piezoelectric film 15 is in contact with the dielectric layer 12 over the top surface 11a of the substrate 11. A bottom electrical contact covering layer 24 formed of copper (Cu) for example is stacked on the bottom electrical contact 23. A bottom electrode 14 formed of metal material such as ruthenium (Ru) or molybdenum (Mo) is disposed on a portion of the bottom surface 15b of the piezoelectric film 15. The bottom surface 15b of the piezoelectric film 15 and the bottom electrode 14 are covered with an oxide layer 13 of silicon dioxide for example. The bottom electrode 14 is electrically connected to a bottom electrical contact 21 formed of copper (Cu) for example, on a location where the piezoelectric film 15 is in contact with the dielectric layer 12 over the top surface 11a of the substrate 11. A bottom electrical contact covering layer 22 formed of copper (Cu) for example is stacked on the bottom electrical contact 21.

The piezoelectric film 15 includes an active region 15c where a main acoustic wave can oscillate during operation. The active region 15c is supported via the slope region 15f connected to the active region 15c by the top surface 11a of the substrate 11 in contact with the piezoelectric film 15 to allow the piezoelectric film 15 of the active region 15c to oscillate in directions perpendicular to the top surface 11a such that an acoustic wave can be excited.

Figure 6A:
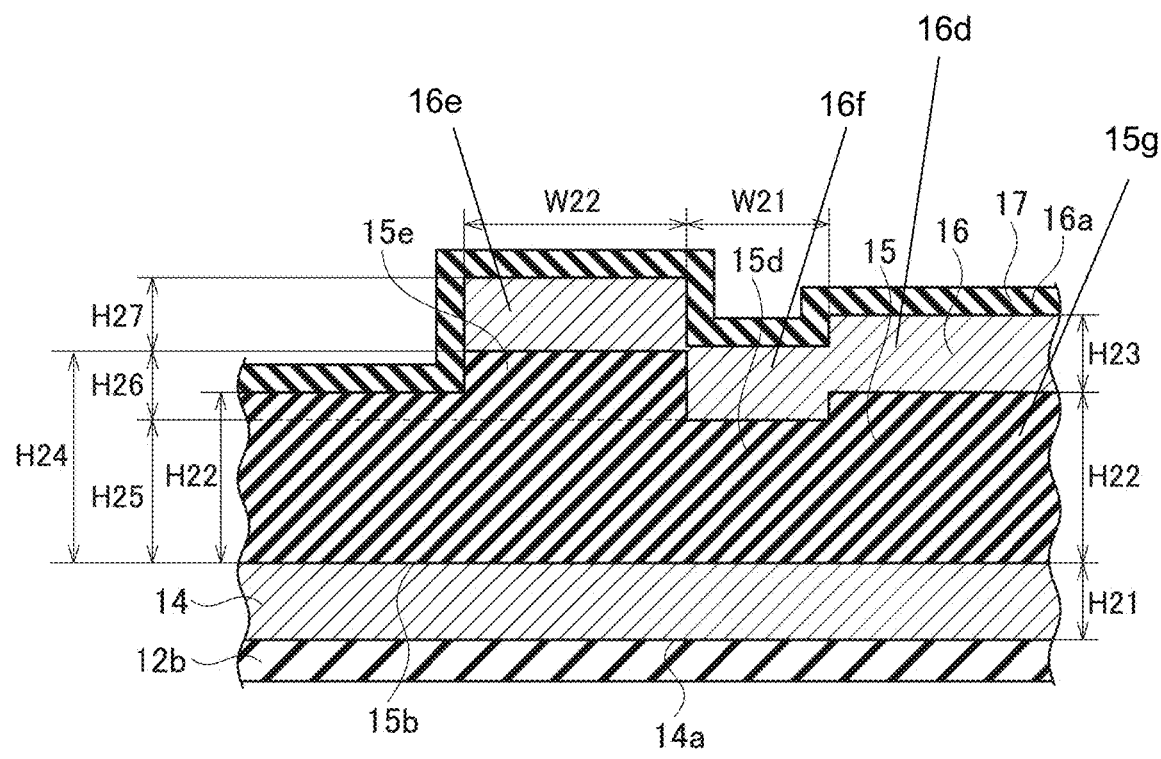
FIG. 6A is an enlarged cross-sectional view of a portion of the film bulk acoustic wave resonator according to the second embodiment shown in FIG. 5.
Figure 6B:
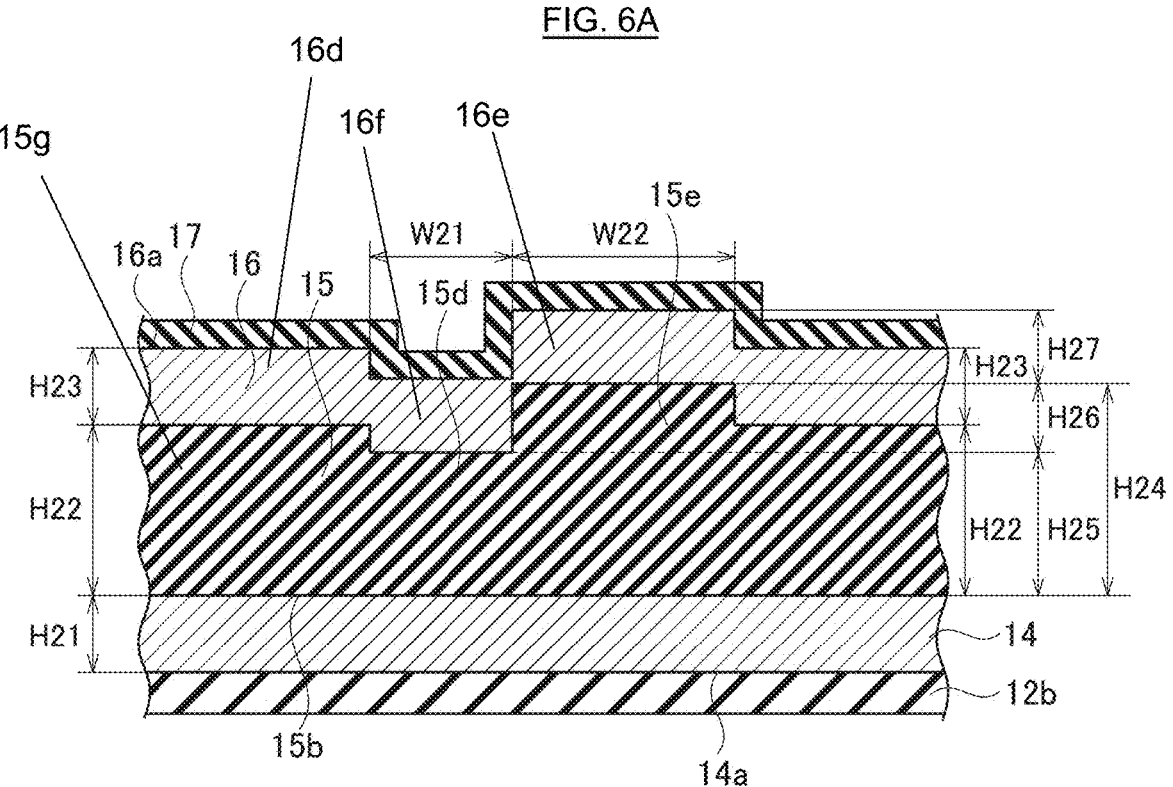
FIG. 6B is an enlarged cross-sectional view of another portion of the film bulk acoustic wave resonator according to the second embodiment shown in FIG. 5.

FIG. 6A is an enlarged cross-sectional view of a portion VIA of the FBAR 50 according to the second embodiment shown in FIG. 5. FIG. 6B is an enlarged cross-sectional view of a portion VIB of the FBAR 50. The piezoelectric film 15 includes a recessed frame portion 15d and a raised frame portion 15e extending adjacent to each other around the active region 15c of the piezoelectric film 15. In the recessed frame portion 15d, the top surface 15a of the piezoelectric film 15 is recessed by a certain depth across a first width W21. In the raised frame portion 15e, the top surface 15a of the piezoelectric film 15 is raised by a certain height across a second width W22. The recessed frame portion 15d is disposed along an inner periphery of the raised frame portion 15e. The first width W21 may range from 1.0 μm to 1.5 μm, and may be 1.25 um, for example. The second width W22 may range from 3.0 μm to 5.0 μm, and may be 4.0 um, for example. The top electrode 16 may have a height H23, i.e., the height from the top surface 15a of the film 15 to the top surface 16a of an inner portion 16d of the top electrode 16 within the periphery of the recessed portion frame portion 15d of the film 15, which may range from 0.2 μm to 0.4 μm, and may be 0.3 um, for example. In the illustrated embodiment, the height H23 of the electrode 16 is the same as the height H26 of the electrode 16 in the recessed frame portion 15d and also the same as the height H27 of the electrode 16 in the raised frame portion 15e. The piezoelectric film 15, e.g., in an inner portion 15g of the film 15 within the periphery of the recessed frame portion 15d, may have a height H22 ranging from 0.8 μm to 1.2 μm. The height H22 may be 1.0 um, for example. The height H25 of the recessed frame portion 15d may be recessed from the height H22 of the piezoelectric film 15 by a distance ranging from 0.3 μm to 0.5 um. For example, the height H25 may be recessed from the height H22 by a distance of 0.4 um and may be 0.96 um. The height H24 of the raised frame portion 15e may be raised from the height H22 of the piezoelectric film 15 by a distance ranging from 0.3 μm to 0.5 um. For example, the height H24 may be raised from the height H22 by a distance of 0.4 μm and may be 1.04 um. The bottom electrode 14 may have a height H21 ranging from 0.2 μm to 0.4 um. The height H21 may be 0.3 um, for example. As shown, in the illustrated embodiment, the top electrode 16 has a corresponding raised frame portion 16e above the raised frame portion 15e of the film 15 and includes a corresponding recessed frame portion 16f above the recessed frame portion 15d of the film 15. In other embodiments, the top electrode 16 can have a flat top surface above one or both of the raised and recessed frame portions 15e, 15d of the film 15. In such alternative embodiments, for example, the top surface of the top electrode 16 above the raised and/or recessed portions 15e, 15d of the film 15 can have the same height as, and be not raised or recessed with respect to, the top surface of the inner portion 16d of the electrode 16.

An acoustic wave may have an increased resonant frequency in the region where the piezoelectric film 15 is recessed in the recessed frame portion 15d to be thinner. Further, an acoustic wave may have a decreased resonant frequency in the region where the piezoelectric film 15 is raised in the raised frame portion 15e to be thicker. Thus, the resonant frequency of the acoustic wave can be controlled on the edge of the active region 15c by providing the recessed frame portion 15d and the raised frame portion 15e toward the periphery of the active region 15c in the piezoelectric film 15. Accordingly, a transverse acoustic wave in the piezoelectric film 15 can be suppressed and generation of a spurious mode due to the transverse acoustic wave can be reduced.

Figure 7:
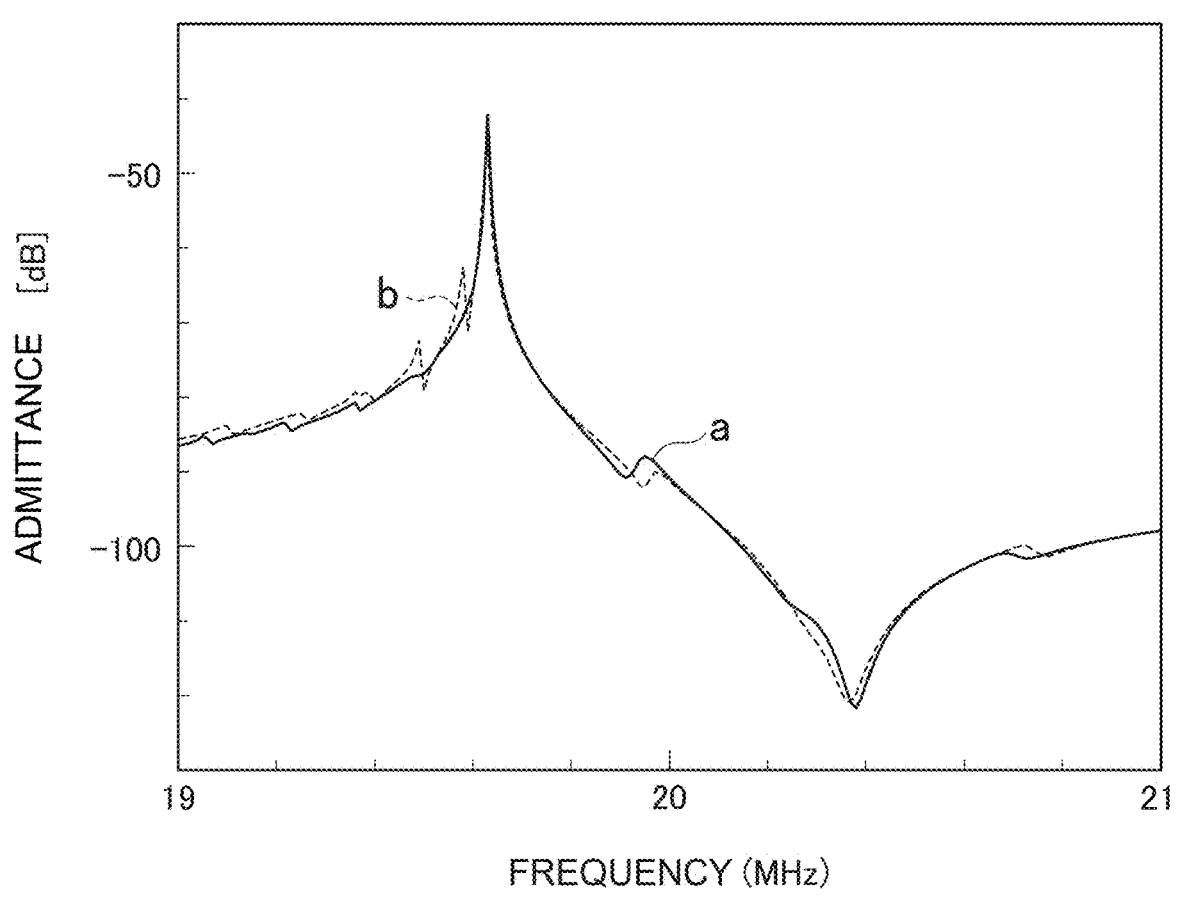
FIG. 7 is a graph showing a frequency characteristic of the film bulk acoustic wave resonator according to the second embodiment.

FIG. 7 is a graph showing a frequency characteristic of the FBAR 50 according to the second embodiment. A solid line "a" in this figure shows the frequency characteristic of the FBAR 50 according to the second embodiment. Also, a dashed line "b" in this figure shows a frequency characteristic of the comparative example FBAR 100 as shown in FIG. 4. The comparative example FBAR 100 may have a configuration similar to the FBAR 50 according to the first embodiment except that none of the recessed frame portion 15d and the raised frame portion 15e is formed. As can be observed in the graph, the generation of a spurious mode that is seen in a lower range (e.g., reflected by the spikes and sawtooth features in the waveform) than the resonant frequency in the comparative example FBAR 100 shown by the dashed line "b" is significantly suppressed in the FBAR 50 according to the second embodiment shown by the solid line "a." Accordingly, the recessed frame portion 15d and the raised framed portion 15e in the FBAR 50 of the second embodiment are beneficial in suppressing a spurious mode.

Film Bulk Acoustic Wave filters

Figure 8:
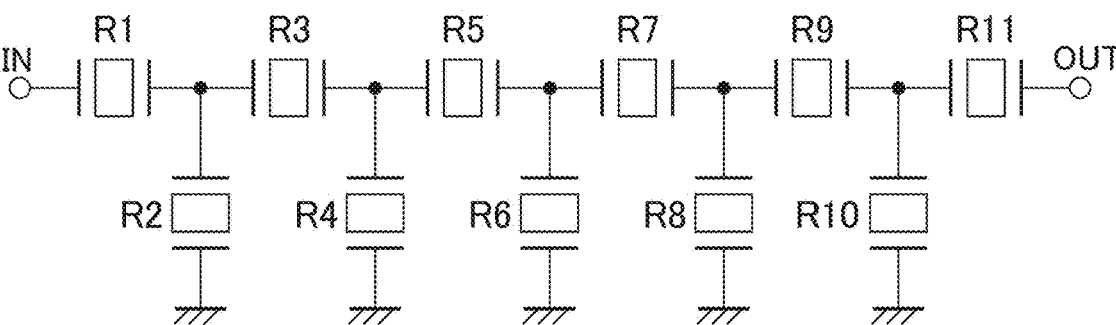
FIG. 8 is a schematic diagram of a film bulk acoustic wave filter.

FIG. 8 is a circuit diagram showing a bulk acoustic wave filter including FBARs according to an embodiment. The FBARs of an embodiment may be combined to form a film bulk acoustic wave filter that can operate in a radio frequency (RF) band. The film bulk acoustic wave filter of an embodiment may include at least one of the FBARs of an embodiment. One type of such filters may be known as a ladder filter. FIG. 8 shows an example of the ladder filter. The ladder filter includes a plurality of FBARs R1, R2, R3, R4, R5, R6, R7, R8, R9, R10 and R11 disposed between an input port IN and an output port OUT. FBARs R1, R3, R5, R7, R9 and R11 configured as series-arm resonators may be connected between the input port and the output node. FBARs R2, R4, R6, R8 and R10 configured as parallel-arm resonators may be connected in parallel between the series-arm resonators R1, R3, R5, R7, R9 and R11 and a ground. The parallel-arm resonators R2, R4, R6, R8 and R10 may be referred to as shunt resonators. In some embodiments, respective series-arm resonators R1, R3, R5, R7, R9 and R11 may have the same resonant frequency. In some embodiments, the plurality of shunt resonators R2, R4, R6, R8 and R10 may have resonant frequencies below those of series-arm resonators R1, R3, R5, R7, R9 and R11, respectively. At least one of the plurality of shunt resonators R2, R4, R6, R8 and R10 may have a first resonant frequency different from a resonant frequency of another one of the other shunt resonator(s). At least one of the plurality of shunt resonators R2, R4, R6, R8 and R10 may have a second resonant frequency different from the first resonant frequency and different from a resonant frequency of another one of the other shunt resonator(s).

Film Bulk Acoustic Wave filter assemblies

Figure 9A:
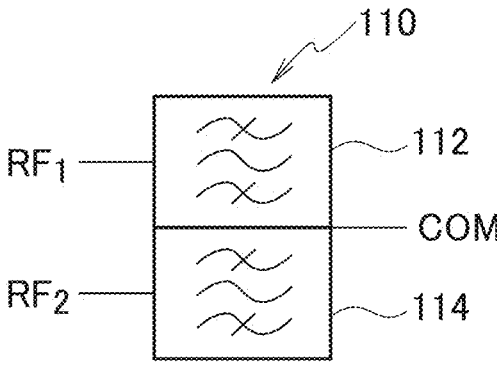
FIG. 9A is a schematic diagram of a duplexer according to an embodiment.

FIG. 9A is a schematic diagram of a duplexer 110 including a film bulk acoustic wave filter according to an embodiment. The duplexer 110 includes a first filter 112 and a second filter 114 coupled to together at a common node COM. One of the filters of the duplexer 110 can be a transmit filter and the other of the filters of the duplexer 110 can be a receive filter. The transmission and receive filters may be configured as respective ladder filters each including a topology similar to the ladder filter shown in FIG. 8. In some other instances, such as in a diversity receive application, the duplexer 110 can include two receive filters. The common node COM can be an antenna node.

The first filter 112 is a film bulk acoustic wave filter arranged to filter a radio frequency signal. The first filter 112 may include FBARs coupled between a first radio frequency node RF1 and the common node COM. The first radio frequency node RF1 can be a transmit node or a receive node. The first filter 112 includes shunt FBARs implemented in accordance with any suitable principles and advantages disclosed herein.

The second filter 114 can be any suitable filter arranged to filter a second radio frequency signal. The second filter 114 can be, for example, an acoustic wave filter, an acoustic wave filter that includes one or more FBARs implemented in accordance with any suitable principles and advantages disclosed herein, an LC filter, a hybrid acoustic wave LC filter, or the like. The second filter 114 is coupled between a second radio frequency node RF2 and the common node COM. The first radio frequency node RF1 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include one or more FBARs implemented in accordance with any suitable principles and advantages disclosed herein.

Figure 9B:
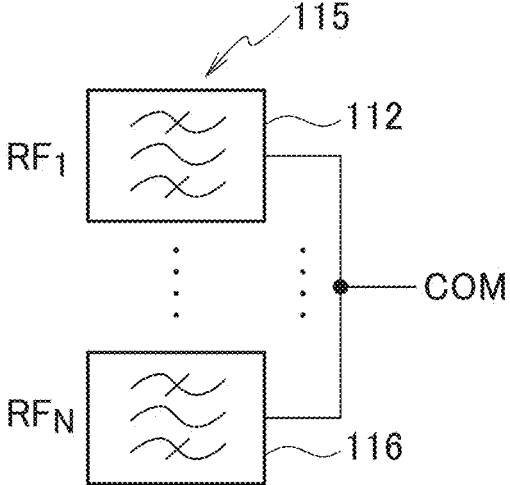
FIG. 9B is a schematic diagram of a multiplexer according to an embodiment.

FIG. 9B is a schematic diagram of a multiplexer 115 that includes a film bulk acoustic wave filter according to an embodiment. The multiplexer 115 includes a plurality of filters 112-116 coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters.

The first filter 112 is a film bulk acoustic wave filter arranged to filter a radio frequency signal. The first radio frequency node RF1 can be a transmit node or a receive node. The first filter 112 includes one or more FBARs implemented in accordance with any suitable principles and advantages disclosed herein. The other filter(s) of the multiplexer 115 can include one or more FBARs, one or more film bulk acoustic wave filters that include one or more FBARs implemented in accordance with any suitable principles and advantages disclosed herein, one or more LC filters, one or more hybrid acoustic wave LC filters, or any suitable combination thereof.

The FBARs discussed herein can be implemented in a variety of packaged modules. Some example packaged modules will now be discussed in which any suitable principles and advantages of the acoustic wave filters and/or acoustic wave resonators discussed herein can be implemented. Example packaged modules may include a package that encloses the illustrated circuit elements. A module including a radio frequency component may be referred to as a radio frequency module. The illustrated circuit elements can be disposed on a common packaging substrate. The packaging substrate can be a laminate substrate, for example. FIGS. 10 to 13 are schematic block diagrams of illustrative packaged modules according to certain embodiments. Any suitable combination of features of these packaged modules can be implemented with each other. While duplexers are illustrated in the example packaged modules of FIGS. 10 to 13, any other suitable multiplexer that includes a plurality of filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 10:
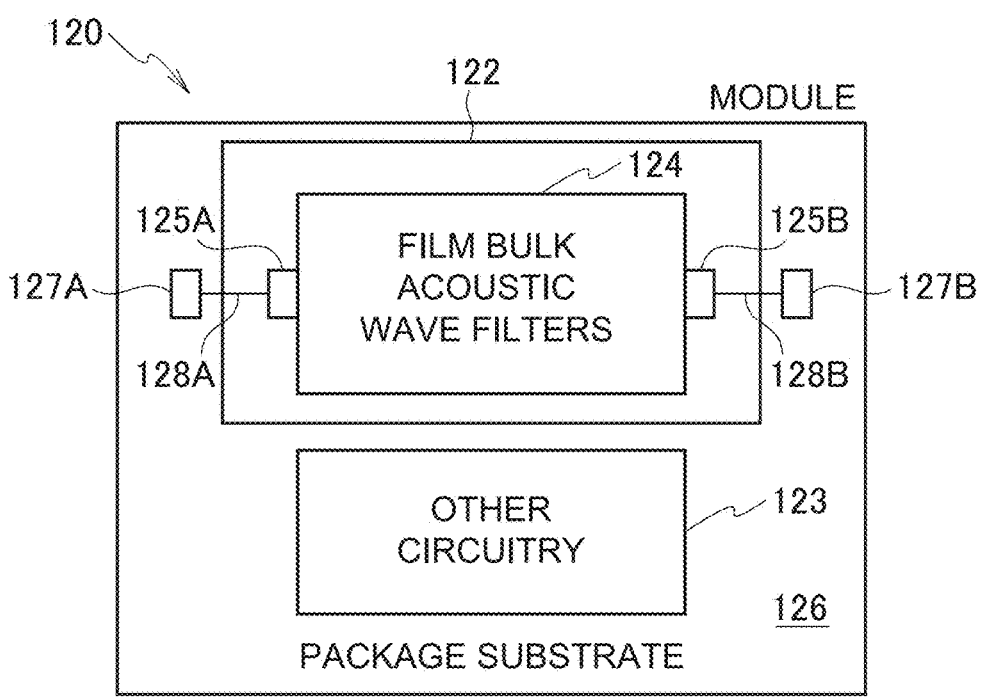
FIG. 10 is a schematic diagram of a radio frequency module according to an embodiment.

FIG. 10 is a schematic diagram of a radio frequency module 120 that includes a film bulk acoustic wave component 122 according to an embodiment. The illustrated radio frequency module 120 includes the film bulk acoustic wave component 122 and other circuitry 123. The film bulk acoustic wave component 122 can include one or more film bulk acoustic wave filters in accordance with any suitable combination of features disclosed herein. The film bulk acoustic wave component 122 can include a FBAR die that includes FBARs, for example.

The film bulk acoustic wave component 122 shown in FIG. 10 includes one or more film bulk acoustic wave filters 124 and terminals 125A and 125B. The one or more film bulk acoustic wave filters 124 include one or more FBARs implemented in accordance with any suitable principles and advantages disclosed herein. The terminals 125A and 125B can serve, for example, as an input contact and an output contact. Although two terminals are illustrated, any suitable number of terminals can be implemented for a particular application. The film bulk acoustic wave component 122 and the other circuitry 123 are on a common package substrate 126 in FIG. 10. The package substrate 126 can be a laminate substrate. The terminals 125A and 1245B can be electrically connected to contacts 127A and 127B, respectively, on the package substrate 126 by way of electrical connectors 128A and 128B, respectively. The electrical connectors 128A and 128B can be bumps or wire bonds, for example.

The other circuitry 123 can include any suitable additional circuitry. For example, the other circuitry can include one or more power amplifiers, one or more radio frequency switches, one or more additional filters, one or more low noise amplifiers, one or more RF couplers, one or more delay lines, one or more phase shifters, the like, or any suitable combination thereof. The other circuitry 123 can be electrically connected to the one or more film bulk acoustic wave filters 124. The radio frequency module 120 can include one or more packaging structures to, for example, provide protection and/or facilitate easier handling of the radio frequency module 120. Such a packaging structure can include an overmold structure formed over the package substrate 126. The overmold structure can encapsulate some or all of the components of the radio frequency module 120.

Figure 11:
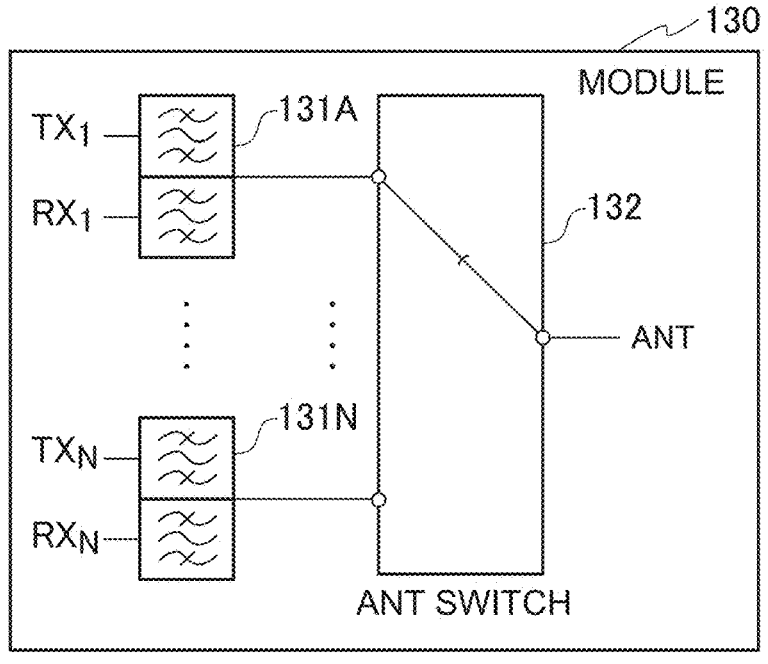
FIG. 11 is a schematic diagram of a radio frequency module according to an embodiment.

FIG. 11 is a schematic block diagram of a radio frequency module 130 that includes duplexers 131A to 131N and an antenna switch 132. One or more filters of the duplexers 131A to 131N can include two or more acoustic wave resonators having resonant frequencies in accordance with any suitable principles and advantages disclosed herein. Any suitable number of duplexers 131A to 131N can be implemented. The antenna switch 132 can have a number of throws corresponding to the number of duplexers 131A to 131N. The antenna switch 132 can include one or more additional throws coupled to one or more filters external to the radio frequency module 130 and/or coupled to other circuitry. The antenna switch 132 can electrically couple a selected duplexer to an antenna port of the radio frequency module 130.

Figure 12:
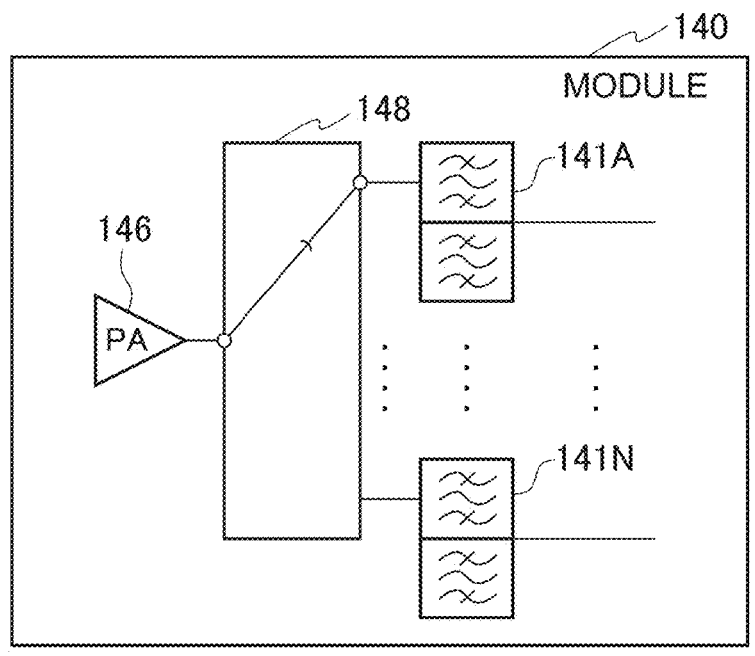
FIG. 12 is a schematic diagram of a radio frequency module according to an embodiment.

FIG. 12 is a schematic block diagram of a radio frequency module 140 that includes a power amplifier 146, a radio frequency switch 148, and duplexers 141A to 141N according to an embodiment. The power amplifier 146 can amplify a radio frequency signal. The radio frequency switch 148 can be a multi-throw radio frequency switch. The radio frequency switch 168 can electrically couple an output of the power amplifier 146 to a selected transmit filter of the duplexers 141A to 141N. One or more filters of the duplexers 141A to 141N can include any suitable number of acoustic wave resonators implemented in accordance with any suitable principles and advantages disclosed herein. Any suitable number of duplexers 141A to 141N can be implemented.

Figure 13:
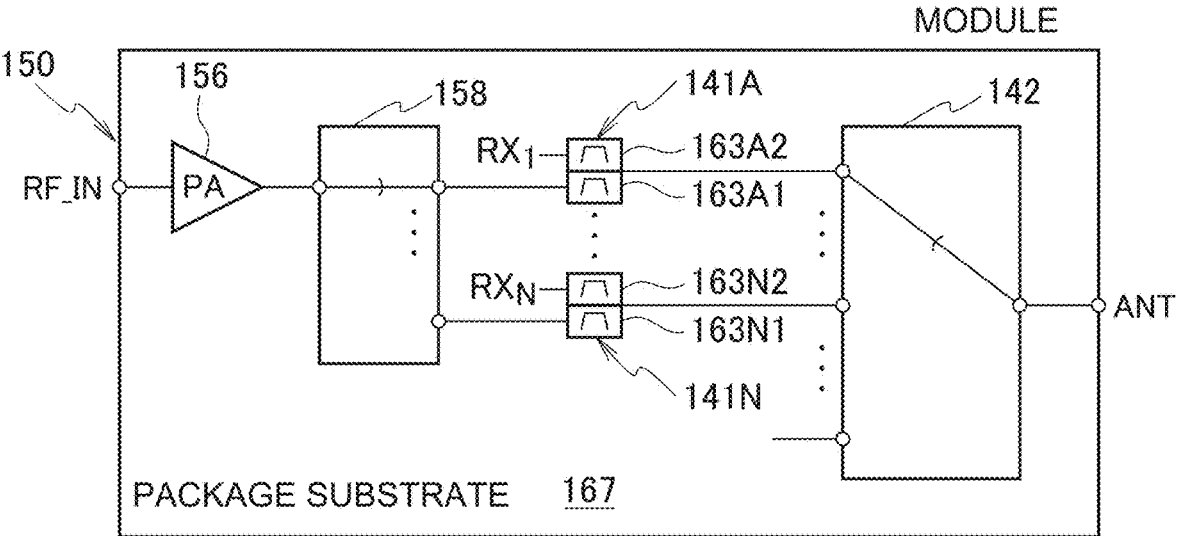
FIG. 13 is a schematic diagram of a radio frequency module according to an embodiment.

FIG. 13 is a schematic diagram of a radio frequency module 150 that includes a film bulk acoustic wave filter according to an embodiment. As illustrated, the radio frequency module 150 includes duplexers 141A to 141N that include respective transmit filters 163A1 to 163N1 and respective receive filters 163A2 to 163N2, a power amplifier 156, a select switch 158, and an antenna switch 142. The radio frequency module 150 can include a package that encloses the illustrated elements. The illustrated elements can be disposed on a common package substrate 167. The packaging substrate 167 can be a laminate substrate, for example. A radio frequency module that includes a power amplifier can be referred to as a power amplifier module. A radio frequency module can include a subset of the elements illustrated in FIG. 13 and/or additional elements. The radio frequency module 150 may include at least one acoustic wave device implemented in accordance with any suitable principles and advantages disclosed herein.

The duplexers 141A to 141N can each include two film bulk acoustic wave filters coupled to a common node. For example, the two film bulk acoustic wave filters can be a transmit filter and a receive filter. As illustrated, the transmit filter and the receive filter can each be a band pass filter arranged to filter a radio frequency signal. One or more of the transmit filters 163A1 to 163N1 can include an acoustic wave resonator implemented in accordance with any suitable principles and advantages disclosed herein. Similarly, one or more of the receive filters 163A2 to 163N2 can include an acoustic wave resonator implemented in accordance with any suitable principles and advantages disclosed herein. Although FIG. 13 illustrates duplexers, any suitable principles and advantages disclosed herein can be implemented in other multiplexers (e.g., quadplexers, hexaplexers, octoplexers, etc.) and/or in switch-plexers.

The power amplifier 156 can amplify a radio frequency signal. The illustrated switch 158 is a multi-throw radio frequency switch. The switch 158 can electrically couple an output of the power amplifier 156 to a selected transmit filter of the transmit filters 163A1 to 163N1. In some instances, the switch 158 can electrically connect the output of the power amplifier 156 to more than one of the transmit filters 163A1 to 163N1. The antenna switch 142 can selectively couple a signal from one or more of the duplexers 141A to 141N to an antenna port ANT. The duplexers 141A to 141N can be associated with different frequency bands and/or different modes of operation (e.g., different power modes, different signaling modes, etc.).

Wireless Communication Devices

Figure 14A:
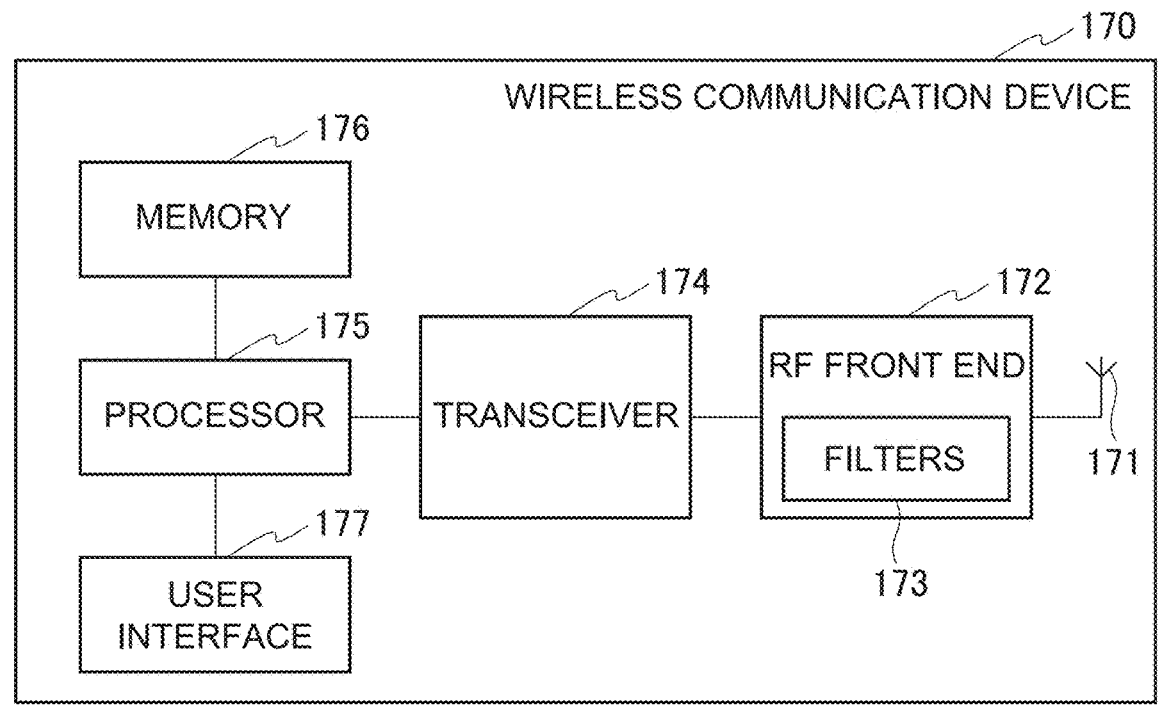
FIG. 14A is a schematic diagram of a wireless communication device according to an embodiment.

The filters including FBARs disclosed herein can be implemented in a variety of wireless communication devices. FIG. 14A is a schematic diagram of a wireless communication device 170 that includes filters 173 in a radio frequency (RF) front end 172 according to an embodiment. One or more of the filters 173 can include an acoustic wave resonator implemented in accordance with any suitable principles and advantages disclosed herein. The wireless communication device 170 can be any suitable wireless communication device. For instance, a wireless communication device 170 can be a mobile phone, such as a smart phone. As illustrated, the wireless communication device 170 includes an antenna 171, an RF front end 172, a transceiver 174, a processor 175, a memory 176, and a user interface 177. The antenna 171 can transmit RF signals provided by the RF front end 172. Such RF signals can include carrier aggregation signals. The antenna 171 can receive RF signals and provide the received RF signals to the RF front end 172 for processing. Such RF signals can include carrier aggregation signals. The wireless communication device 170 can include two or more antennas in certain instances.

The RF front end 172 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 172 can transmit and receive RF signals associated with any suitable communication standards. One or more of the filters 173 can include an acoustic wave resonator that includes any suitable combination of features of the embodiments disclosed above.

The transceiver 174 can provide RF signals to the RF front end 172 for amplification and/or other processing. The transceiver 174 can also process an RF signal provided by a low noise amplifier of the RF front end 172. The transceiver 174 is in communication with the processor 175. The processor 175 can be a baseband processor. The processor 175 can provide any suitable base band processing functions for the wireless communication device 170. The memory 176 can be accessed by the processor 175. The memory 176 can store any suitable data for the wireless communication device 170. The user interface 177 can be any suitable user interface, such as a display with touch screen capabilities.

Figure 14B:
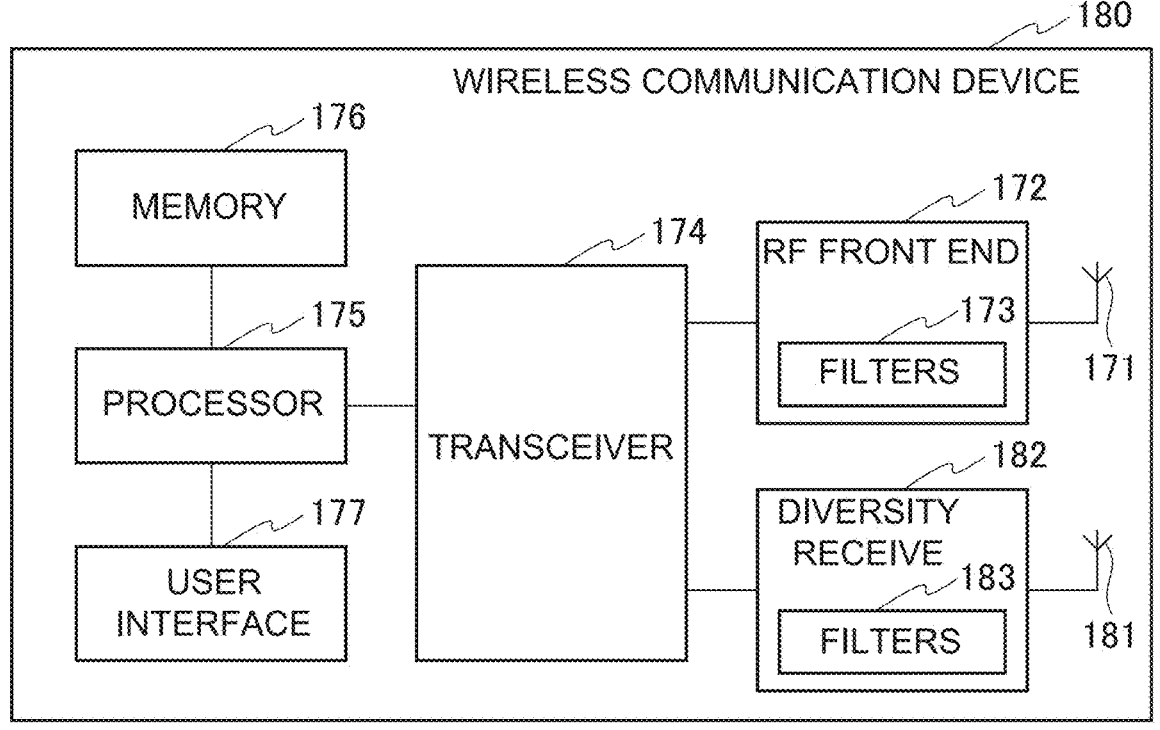
FIG. 14B is a schematic diagram of a wireless communication device according to an embodiment.

FIG. 14B is a schematic diagram of a wireless communication device 180 that includes filters 173 in a radio frequency front end 172 and second filters 183 in a diversity receive module 182. The wireless communication device 180 is like the wireless communication device 170 of FIG. 14A, except that the wireless communication device 180 also includes diversity receive features. As illustrated in FIG. 14B, the wireless communication device 180 includes a diversity antenna 181, a diversity module 182 configured to process signals received by the diversity antenna 181 and including filters 183, and a transceiver 174 in communication with both the radio frequency front end 172 and the diversity receive module 182. One or more of the second filters 183 can include an acoustic wave resonator implemented in accordance with any suitable principles and advantages disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure.

Indeed, the novel resonators, filters, multiplexers, devices, modules, wireless communication devices, apparatus, methods, and systems described herein may be embodied in a variety of other forms. Furthermore, various omissions, substitutions and changes in the form of the resonators, filters, multiplexers, devices, modules, wireless communication devices, apparatus, methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A film bulk acoustic wave resonator comprising:
   a substrate;
   a piezoelectric film supported to oscillate above a main surface of the substrate, the piezoelectric film including a recessed frame portion and a raised frame portion extending adjacent to each other along a periphery of an active area of the film, the raised frame portion spaced from a central portion of the active area by the recessed frame portion; and
   a pair of top and bottom electrodes formed respectively on top and bottom surfaces of the film, the top electrode including a recessed frame portion and a raised frame portion extending adjacent to each other along the periphery of the active area of the film, the active area oscillating during an operation of the film, the recessed frame portion and raised frame portion of the top electrode above the recessed frame portion and raised frame portion of the piezoelectric film, respectively.

2. The film bulk acoustic wave resonator of claim 1 wherein the recessed frame portion is formed along an inner periphery of the raised frame portion.

3. The film bulk acoustic wave resonator of claim 1 wherein the top electrode includes an inner portion within the periphery of the recessed frame portion, a top surface of the recessed frame portion is recessed from a top surface of the raised frame portion by a first distance, and the top surface of the recessed frame portion is recessed from a top surface of the inner portion by a second distance less than the first distance.

4. The film bulk acoustic wave resonator of claim 1 wherein the recessed frame portion has a first width and the raised frame portion has a second width different than the first width.

5. The film bulk acoustic wave resonator of claim 4 wherein the second width is greater than the first width.

6. The film bulk acoustic wave resonator of claim 1 wherein a cavity resides between the active area of the piezoelectric film and the substrate.

7. A film bulk acoustic wave filter comprising:
   a plurality of film bulk acoustic wave resonators configured to filter a radio frequency signal, at least one of the plurality of film bulk acoustic wave resonators including a substrate, a piezoelectric film supported to oscillate above main surface of the substrate, the piezoelectric film including a recessed frame portion and a raised frame portion extending adjacent to each other along a periphery of an active area of the film, the raised frame portion spaced from a central portion of the active area by the recessed frame portion, and a pair of top and bottom electrodes formed respectively on top and bottom surfaces of the film, the top electrode including a recessed frame portion and a raised frame portion extending along the periphery of the active area of the film, the active area oscillating during an operation of the film, the recessed frame portion and raised frame portion of the top electrode above the recessed frame portion and raised frame portion of the piezoelectric film, respectively.

8. The film bulk acoustic wave filter of claim 7 wherein the recessed frame portion is formed along an inner periphery of the raised frame portion.

9. The film bulk acoustic wave filter of claim 7 wherein the top electrode includes an inner portion within the periphery of the recessed frame portion, a top surface of the recessed frame portion is recessed from a top surface of the raised frame portion by a first distance, and the top surface of the recessed frame portion is recessed from a top surface of the inner portion by a second distance less than the first distance.

10. The film bulk acoustic wave resonator of claim 7 wherein the recessed frame portion has a first width and the raised frame portion has a second width different than the first width.

11. The film bulk acoustic wave resonator of claim 10 wherein the second width is greater than the first width.

12. The film bulk acoustic wave resonator of claim 1 wherein a cavity resides between the active area of the piezoelectric film and the substrate.

13. A film bulk acoustic wave filter assembly comprising:
a first film bulk acoustic wave filter coupled to a common node; and
a second film bulk acoustic wave filter coupled to the common node, at least one of the first film bulk acoustic wave filter and the second film bulk acoustic wave filter including a plurality of film bulk acoustic wave resonators to filter a radio frequency signal, at least one of the plurality of film bulk acoustic wave resonators including a substrate, a piezoelectric film supported to oscillate above a main surface of the substrate, the piezoelectric film including a recessed frame portion and a raised frame portion extending adjacent to each other along a periphery of an active area of the film, the raised frame portion spaced from a central portion of the active area by the recessed frame portion, and a pair of top and bottom electrodes formed respectively on top and bottom surfaces of the film, the top electrode including a recessed frame portion and a raised frame portion extending along the periphery of the active area of the film, the active area oscillating during an operation of the film, the recessed frame portion being formed along an inner periphery of the raised frame portion, the recessed frame portion and raised frame portion of the top electrode above the recessed frame portion and raised frame portion of the piezoelectric film, respectively.

14. A wireless communication device comprising:
an antenna; and
a multiplexer coupled to the antenna, the multiplexer including a plurality of filters coupled to a common node and arranged to filter a radio frequency signal, the plurality of filters including a film bulk acoustic wave filter, the film bulk acoustic wave filter including a plurality of film bulk acoustic wave resonators, at least one of the plurality of film bulk acoustic wave resonators including a substrate, a piezoelectric film supported to oscillate above a main surface of the substrate, the piezoelectric film including a recessed frame portion and a raised frame portion extending adjacent to each other along a periphery of an active area of the film, the raised frame portion spaced from a central portion of the active area by the recessed frame portion, and a pair of top and bottom electrodes formed respectively on top and bottom surfaces of the film, the top electrode including a recessed frame portion and a raised frame portion extending adjacent to each other along the periphery of the active area of the film, the active area oscillating during an operation of the film, the recessed frame portion and raised frame portion of the top electrode above the recessed frame portion and raised frame portion of the piezoelectric film, respectively.

15. The wireless communication device of claim 14 wherein the recessed frame portion is formed along an inner periphery of the raised frame portion.

16. The wireless communication device of claim 14 wherein the top electrode includes an inner portion within the periphery of the recessed frame portion, a top surface of the recessed frame portion is recessed from a top surface of the raised frame portion by a first distance, and the top surface of the recessed frame portion is recessed from a top surface of the inner portion by a second distance less than the first distance.

17. The wireless communication device of claim 14 wherein the recessed frame portion has a first width and the raised frame portion has a second width different than the first width.

18. A bulk acoustic wave resonator comprising:
a substrate;
a piezoelectric layer on the substrate, the piezoelectric layer including a recessed frame portion and a raised frame portion extending adjacent to each other along a periphery of an active region of the piezoelectric layer, the raised frame portion spaced from a central portion of the active region by the recessed frame portion; and
first and second electrodes on opposing sides of the piezoelectric layer, the first electrode including a recessed frame portion and a raised frame portion formed along the periphery of the active region of the bulk acoustic wave resonator, the recessed frame portion and raised frame portion of the first electrode above the recessed frame portion and raised frame portion of the piezoelectric layer, respectively, the second electrode being disposed opposite to the substrate via a cavity.

* * * * *